United States Patent
Hsu et al.

(10) Patent No.: US 11,108,388 B1
(45) Date of Patent: Aug. 31, 2021

(54) SILICON CARBIDE POWER DEVICE, DRIVING CIRCUIT AND CONTROL METHOD

(71) Applicant: SHANGHAI HESTIA POWER, INC., Shanghai (CN)

(72) Inventors: Fu-Jen Hsu, Hsinchu (TW); Chien-Chung Hung, Hsinchu (TW); Kuo-Ting Chu, Hsinchu (TW); Chwan-Ying Lee, Hsinchu (TW)

(73) Assignee: Shanghai Hestia Power, Inc., Shanghai (CN)

( * ) Notice: Subject to any disclaimer, the term of this patent is extended or adjusted under 35 U.S.C. 154(b) by 0 days.

(21) Appl. No.: 16/806,265

(22) Filed: Mar. 2, 2020

(51) Int. Cl.
*H03K 17/16* (2006.01)
*H01L 29/16* (2006.01)

(52) U.S. Cl.
CPC ........ *H03K 17/162* (2013.01); *H01L 29/1608* (2013.01)

(58) Field of Classification Search
CPC .... H03K 17/162; H03K 17/163; H03K 17/16; H03K 17/161; H03K 19/00346; H01L 29/1608
See application file for complete search history.

(56) References Cited

U.S. PATENT DOCUMENTS

| | | | |
|---|---|---|---|
| 7,808,301 B2* | 10/2010 | Chen | H02M 3/073 327/536 |
| 9,018,640 B1 | 4/2015 | Hung et al. | |
| 9,373,713 B2 | 6/2016 | Yen et al. | |
| 10,020,368 B2 | 7/2018 | Yen et al. | |
| 10,483,398 B2 | 11/2019 | Yen et al. | |
| 2010/0156513 A1* | 6/2010 | Saldivar | H02M 3/073 327/536 |

OTHER PUBLICATIONS

Zhang et al., "A Magnetic Coupling Gate Driver for Crosstalk Suppression of SiC MOSFETs," IEEE Transactions on Industrial Electronics, vol. 64, No. 11, Nov. 2017, pp. 9052-9063, 12 pages.

* cited by examiner

*Primary Examiner* — Jung Kim
(74) *Attorney, Agent, or Firm* — Muncy, Geissler, Olds & Lowe, P.C.

(57) ABSTRACT

A silicon carbide power device controlled by a driver and comprises a gate-to-source voltage and a source voltage, wherein the source voltage decreases according to an increase of the gate-to-source voltage, or the source voltage increases according to a decrease of the gate-to-source voltage. Thus, a spike caused by a change of the gate-to-source voltage is suppressed, thereby suppressing the crosstalk phenomenon of the silicon carbide power device.

1 Claim, 10 Drawing Sheets

SILICON CARBIDE POWER DEVICE, DRIVING CIRCUIT AND CONTROL METHOD

FIELD OF THE INVENTION

The invention relates to a power device, a driving circuit and a control method, in particular to a silicon carbide power device, a driving circuit and a control method.

BACKGROUND OF THE INVENTION

Silicon carbide power devices have the advantages of high operating voltage, high operating temperature, low on-resistance, and high switching frequency. In particular, silicon carbide metal-oxide-semiconductor field-effect transistor (SiC MOSFET) and silicon carbide insulated gate bipolar transistor (SiC IGBT) are suitable for use in the recent demand for electric vehicles and 5G communications. The related technology is found in U.S. Pat. No. 9,018,640 B1, U.S. Pat. No. 9,373,713 B2, U.S. Pat. No. 10,020,368 B2, U.S. Pat. No. 10,483,389 B2, etc.

However, compared to traditional silicon power devices, the gate and source of silicon carbide power devices have a narrower voltage tolerance range and a lower ability to withstand negative voltages. At high switching frequencies, the bridge arm circuit is prone to crosstalk. This problem has been described in "A Magnetic Coupling Based Gate Driver for Crosstalk Suppression of SiC MOSFETs" published by Binfeng Zhang et al. In IEEE Transactions On Industrial Electronics, Vol. 64, No. 11, November 2017. At present, the crosstalk phenomenon of silicon carbide power components has not been effectively solved. In view of this, traditional silicon carbide power devices still need improvement.

SUMMARY OF THE INVENTION

The object of the present invention is to solve the problem that the conventional silicon carbide power device is prone to crosstalk.

To achieve the above object, the present invention provides a method for controlling a silicon carbide power device, the method comprising the following steps: providing a silicon carbide power device. The silicon carbide power device is controlled by a driver and has a gate-to-source voltage and a source voltage, wherein the source voltage has at least a high level, a low level, and an intermediate level between the high level and the low level; and the driver alternately outputting an upper bridge trigger signal and a lower bridge trigger signal to a gate of the silicon carbide power device, wherein when the gate-to-source voltage increases according to the upper bridge trigger signal or the lower bridge trigger signal, the source voltage decreases from the intermediate level to the low level or from the high level to the intermediate level, and when the gate-to-source voltage decreases according to the upper bridge trigger signal or the lower bridge trigger signal, the source voltage increases from the low level to the intermediate level or from the intermediate level to the high level.

To achieve the above object, the present invention also provides a silicon carbide power device, which is controlled by a driver and has a gate-to-source voltage and a source voltage, wherein the source voltage decreases according to the increase of the gate-to-source voltage, or the source voltage increases according to the decrease of the gate-to-source voltage, thereby suppressing a spike caused by gate-to-source voltage change.

To achieve the above object, the present invention further provides a driving circuit comprising: a silicon carbide power device with a gate-to-source voltage and a source voltage; a driver which controls the silicon carbide power device; and a compensation module which controls the source voltage to decrease according to an increase of the gate-to-source voltage, or controlling the source voltage to increase according to a decrease of the gate-to-source voltage, thereby suppressing a spike caused by gate-to-source voltage change.

The invention controls the source voltage to suppress the spike caused by the change of the gate-to-source voltage, thereby solving the problem of the crosstalk phenomenon occurring in the silicon carbide semiconductor power element.

DETAILED DESCRIPTION OF THE PREFERRED EMBODIMENTS

The detailed description and technical contents of the present invention are described below with reference to the drawings:

The invention provides a method for controlling a silicon carbide power device, which is applied to a driving circuit including a silicon carbide power device. The silicon carbide power device may be an insulated gate bipolar transistor (IGBT), a metal-oxide-semiconductor field-effect transistor (MOSFET), a junction gate field-effect transistor (JFET) or other power devices. The silicon carbide power device is controlled by a driver and has a gate-to-source voltage (Vgs) and a source voltage (Vs).

Figure 1:
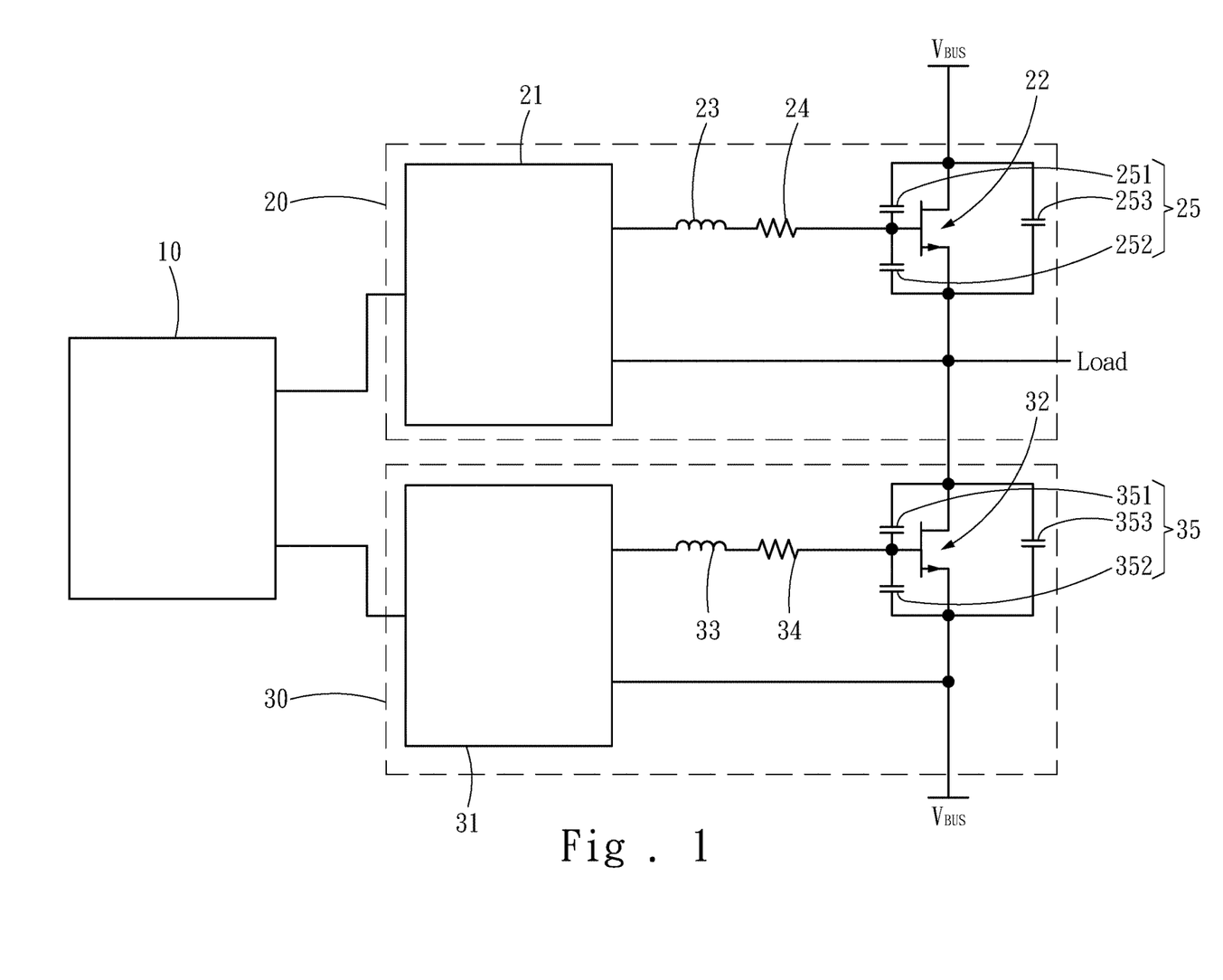
FIG. 1 is a schematic diagram of a circuit structure applied to a half-bridge circuit of an embodiment of the present invention.

FIG. 1 is a schematic diagram of a circuit structure applied to a half-bridge circuit of an embodiment of the present invention. The silicon carbide power device is applied to the half-bridge circuit as an example The half-bridge circuit comprises a controller 10, an upper bridge arm circuit 20 and a lower bridge arm circuit 30. The upper bridge arm circuit 20 includes a first driver 21, a first silicon carbide power device 22, a first inductor 23, a first resistor 24, and a plurality of first capacitors 25. The first inductor 23 and the first resistor 24 are connected in series between the first driver 21 and the first silicon carbide power device 22. The first capacitor 25 includes a gate-drain capacity 251, a gate-source capacity 252 and a drain-source capacity 253. The lower bridge arm circuit 30 includes a second driver 31, a second silicon carbide power device 32, a second inductor 33, a second resistor 34, and a plurality of second capacitors 35. The second inductor 33 and the second resistor 34 are connected in series between the second driver 31 and the second silicon carbide power device 32. The second capacitor 35 includes a gate-drain capacitor 351, a gate-source capacitor 352, and a drain-source capacitor 353.

Figure 2:
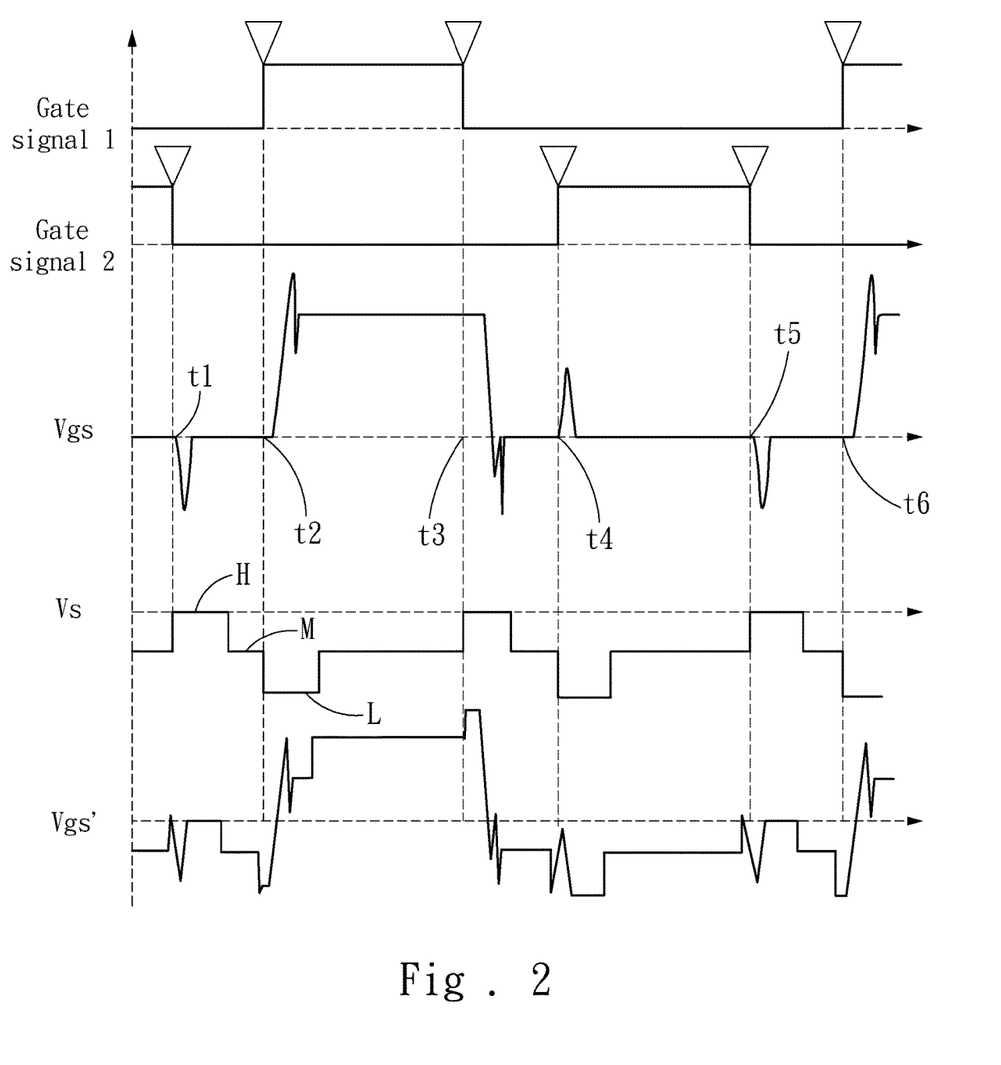
FIG. 2 is a schematic diagram of a voltage output of a silicon carbide power device of the present invention.

FIG. 1 and FIG. 2 are schematic diagrams of the voltage output of a silicon carbide power device of an embodiment of the present invention. The source voltage (Vs) has at least a high level (H), a low level (L), and an intermediate level (M) between the high level (H) and the low level (L). During driving, the first driver 21 and the second driver 31 alternately output an upper bridge trigger signal (Gate signal 1) and a lower bridge trigger single (Gate signal 2) to gates of the first silicon carbide power device 22 and the second silicon carbide power device 32. In the present invention, when the gate-to-source voltage (Vgs) of each of the first silicon carbide power device 22 and the second silicon carbide power device 32 increases according to the upper bridge trigger signal (Gate signal 1) and the lower bridge trigger single (Gate signal 2), the source voltage (Vs) is controlled to decrease from the intermediate level (M) to the low level (L) or from the high level (H) to the intermediate level (M). When the gate-to-source voltage (Vgs) of each of the first silicon carbide power device 22 and the second silicon carbide power device 32 decreases according to the upper bridge trigger signal (Gate signal 1) or the lower bridge trigger signal (Gate signal 2), the source voltage (Vs) increases from the low level (L) to the intermediate level (M) or from the intermediate level (M) to the high level (H).

As shown in FIG. 2, at time points (t1) and (t5), the lower bridge trigger signal (Gate signal 2) drops, causing the gate-to-source voltage (Vgs) to produce a negative peak. At these points, the source voltage (Vs) is controlled to rise from the intermediate level (M) to the high level (H), so as to suppress or reduce the spike of the gate-to-source voltage (Vgs). At time points (t2) and (t6), the upper bridge trigger signal (Gate signal 1) rises, causing the gate-to-source voltage (Vgs) to generate a positive peak. At these points, the source voltage (Vs) is controlled to drop from the intermediate level (M) to the low level (L) to suppress or reduce the spike of the gate-to-source voltage (Vgs). At time point (t3), the upper gate trigger signal (Gate signal 1) decreases, causing the gate-to-source voltage (Vgs) to generate a negative peak. At this point, the source voltage (Vs) is controlled to rise from the intermediate level (M) to the high level (H) to suppress or reduce the spike of the gate-to-source voltage (Vgs). At time point (t4), the lower bridge trigger signal (Gate signal 2) rises, causing the gate-to-source voltage (Vgs) to generate a positive peak. At this point, the source voltage (Vs) is controlled to drop from the intermediate level (M) to the low level (L). In FIG. 2, "Vgs" represents the gate-to-source voltage without using the method of the present invention, and spikes obviously exist; "Vgs" represents the gate-to-source voltage using the method of the present invention, and it can be clearly seen that the spikes are suppressed and improved.

Figure 3:
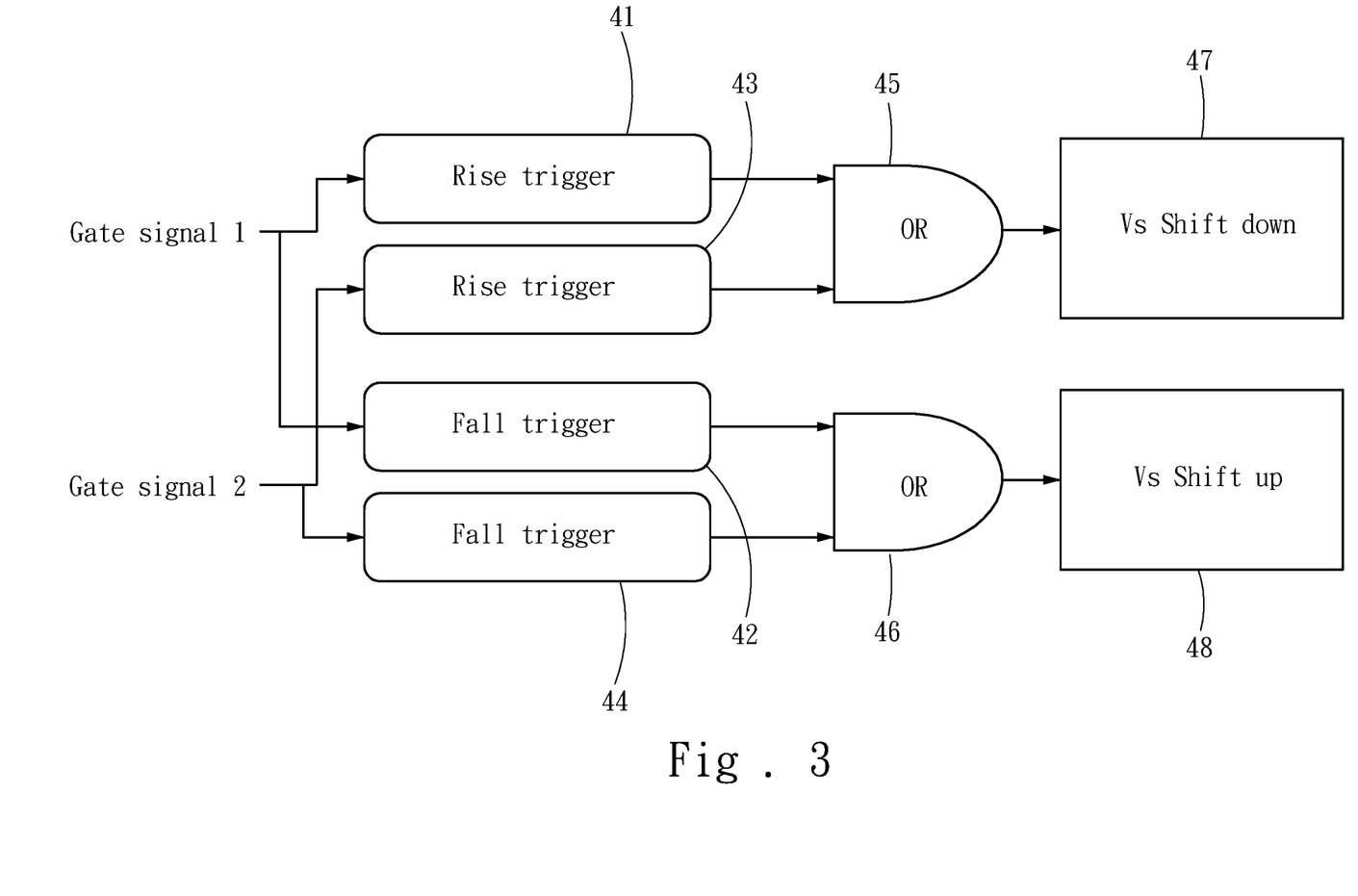
FIG. 3 is a schematic logic block diagram of an embodiment of the present invention.

FIG. 3 is a schematic logic block diagram of an embodiment, and is used to explain the judgment and operation mechanism of the control method. In the embodiment, a block 41 or a block 42 is used to determine whether the upper bridge trigger signal (Gate signal 1) is rising or falling A block 43 or a block 44 is used to determine whether the lower bridge trigger signal (Gate signal 2) is rising or falling The blocks 41 and 43 send a first result associated with a rising trigger signal to a block 45 after the determination, and the blocks 42 and 44 send a second result associated with a dropping trigger signal to a block 46 after the determination. In the embodiment, the block 45 and the block 46 are an OR gate. If the output of any of the first results is true, a block 47 will be triggered, that is, the source voltage (Vs) will be controlled to decrease. Conversely, if the output of any of the second results is true, the block 48 will be triggered, that is, controlling the source voltage (Vs) to rise, so as to achieve the effect of suppressing or reducing the spike of the gate-to-source voltage (Vgs).

Figure 4:
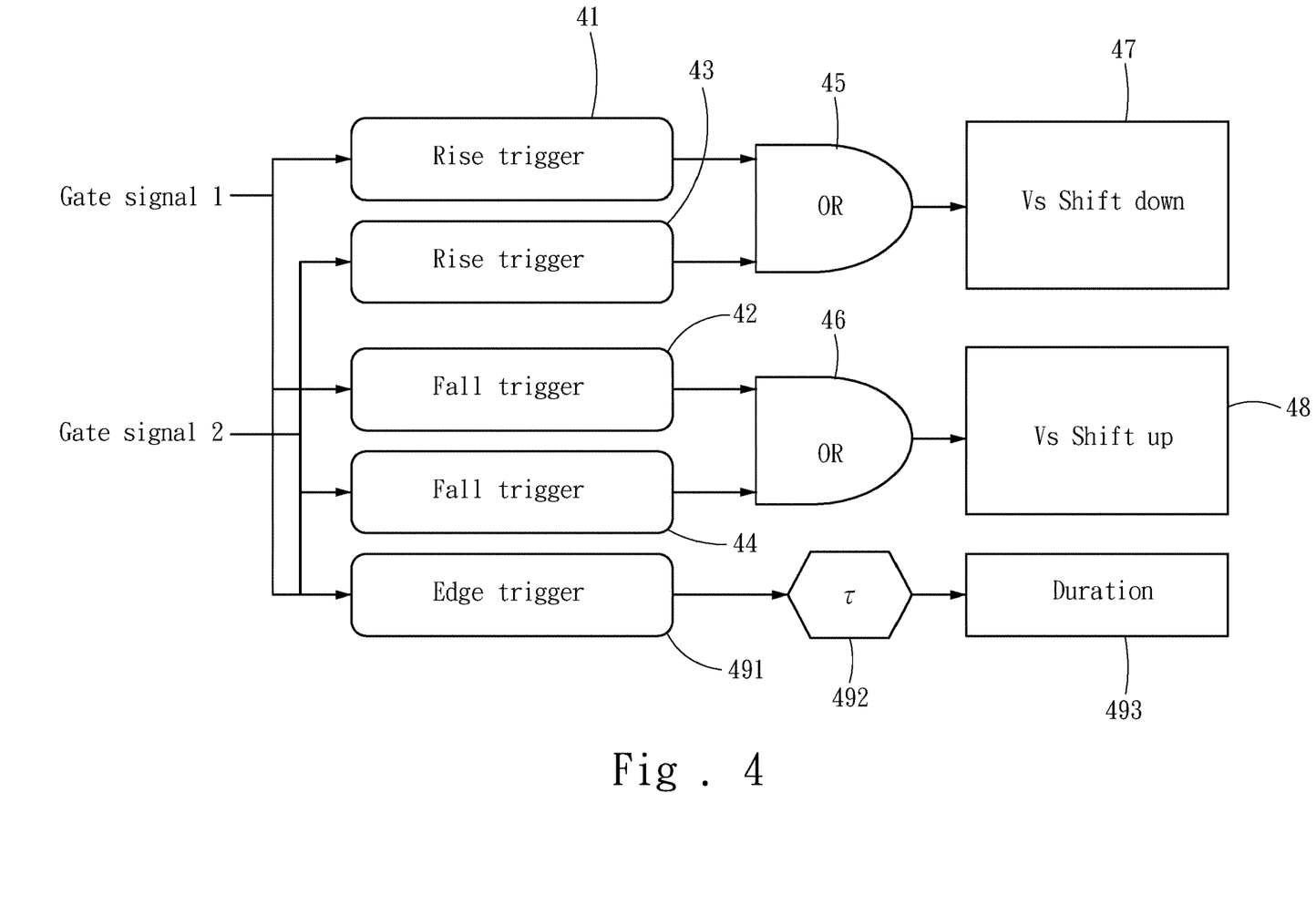
FIG. 4 is a schematic logic block diagram of another embodiment of the present invention.

FIG. 4 is a schematic logic block diagram of another embodiment. Compared with the embodiment shown in FIG. 3, in this embodiment, blocks 491, 492, and 493 are added. When the block 491 detects a waveform change of the upper bridge trigger signal (Gate signal 1) or the lower bridge trigger signal (Gate signal 2), the output thereof is changed (i.e. the edge trigger), and a delay in the rise or fall of the source voltage (Vs) occurs through the block 492, wherein the delay is the duration of the rise or fall of the source voltage (Vs). Finally, the block 493 is triggered to allow the source voltage (Vs) to continually rise or fall for a period of time.

Figure 5:
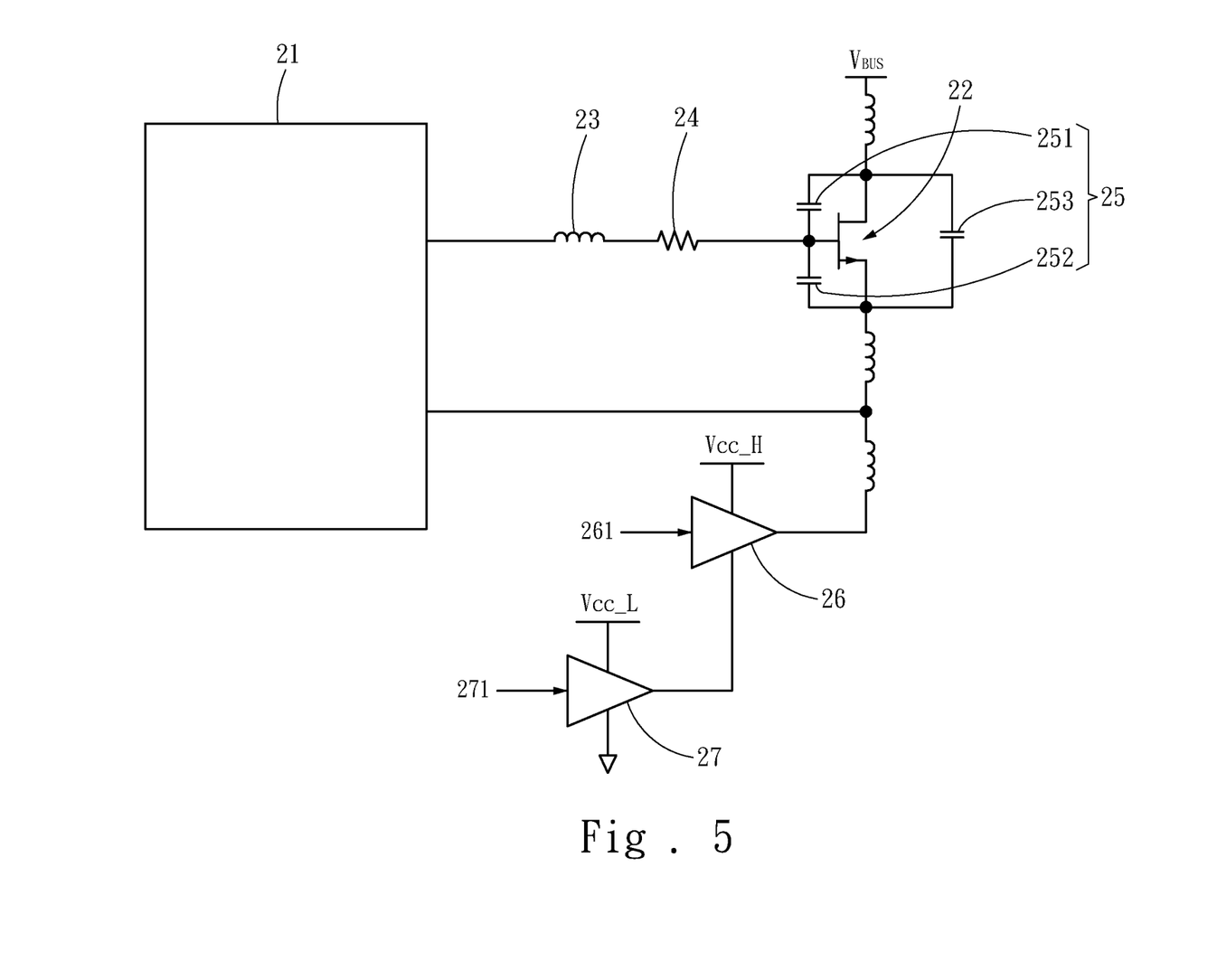
FIG. 5 is a schematic diagram of a circuit structure of an embodiment of the present invention.

In the invention, the detection of the upper bridge trigger signal (Gate signal 1) and the lower bridge trigger signal (Gate signal 2) and the control of the gate-to-source voltage (Vgs) are performed by a compensation module. The compensation module includes a first compensation unit and a second compensation unit. The first compensation unit detects the upper bridge trigger signal (Gate signal 1) and the lower bridge trigger signal (Gate signal 2), and when the gate-to-source voltage (Vgs) increases according to the upper bridge trigger signal (Gate signal 1) or the lower bridge trigger signal (Gate signal 2), the source voltage (Vs) is controlled to decrease. The second compensation unit detects the upper bridge trigger signal (Gate signal 1) or the lower bridge trigger signal (Gate signal 2), and when the gate-to-source voltage (Vgs) decreases according to the upper bridge trigger signal (Gate signal 1) or the lower bridge trigger signal (Gate signal 2), the source voltage (Vs) is controlled to increase. FIG. 5 is a schematic diagram of a circuit structure of an embodiment. In the embodiment, a three-level gate driver is applied as an example of the compensation module, which includes a driver 21, a silicon carbide power device 22, a first inductor 23, a first resistor 24, a plurality of first capacitors 25, a first amplifier 26 and a second amplifier 27. The first inductor 23 and the first resistor 24 are connected in series between the driver 21 and the silicon carbide power device 22. The first capacitor 25 includes a gate-drain capacitor 251, a gate-source capacitor 252, and a drain-source capacitor 253. The driver 21 outputs a trigger signal to the silicon carbide power device 22, and the trigger signal may be a positive voltage or a negative voltage. The first amplifier 26 and the second amplifier 27 respectively receive a first input signal 261 and a second input signal 271. The first input signal 261 and the second input signal 271 are associated with the trigger signal. For example, when the trigger signal is the positive voltage, both of the first input signal 261 and the second input signal 271 are low-level potential, and the source voltage drops. When the trigger signal is the negative voltage, both of the first input signal 261 and the second input signal 271 are high-level potential, and the source voltage rises (order 0). When the trigger signal changes to the negative voltage or changes the positive voltage, the first input signal 261 and the second input signal 271 are respectively the high-level potential and the low-level potential, or are respectively the low-level potential and the high-level potential, and the source voltage remains unchanged (order 2).

Figure 6:
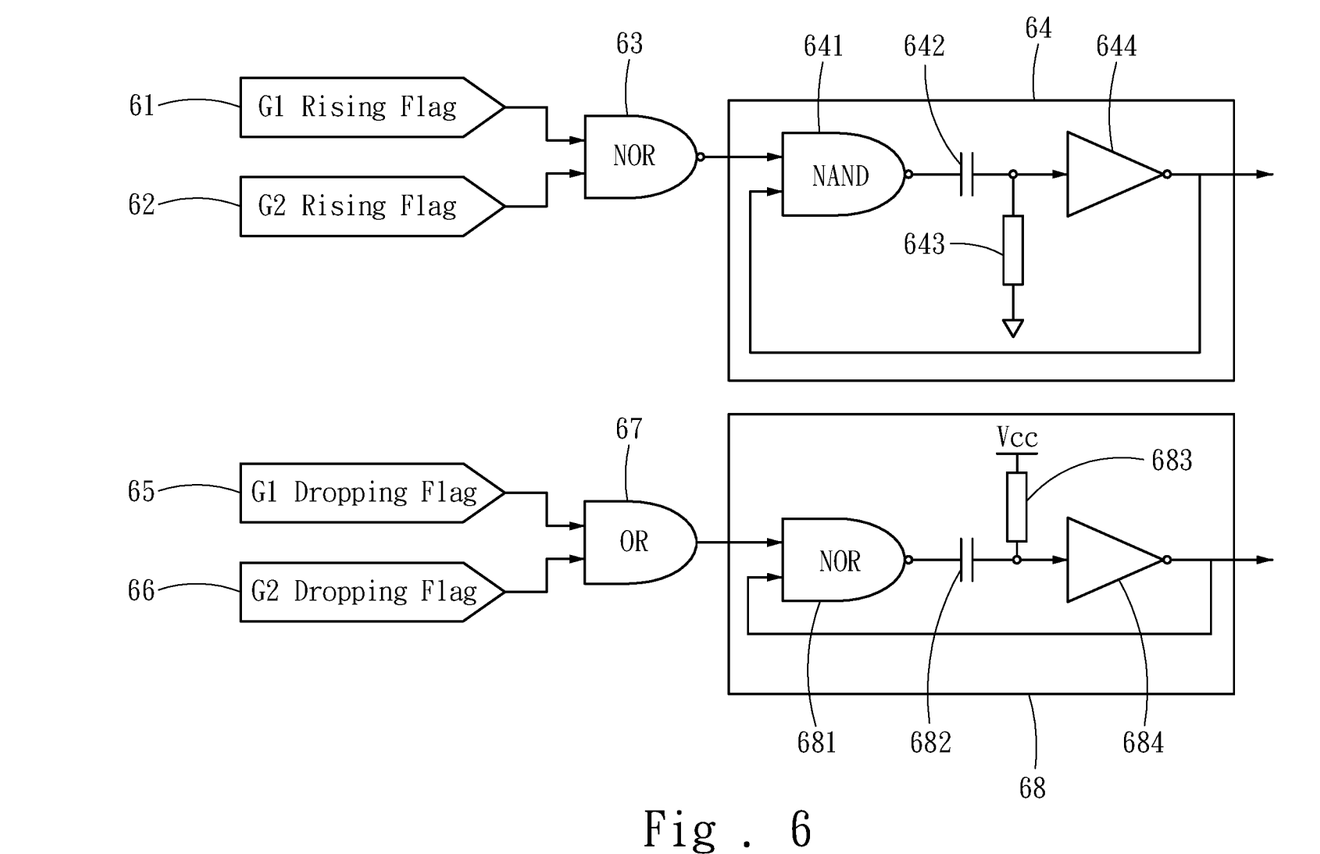
FIG. 6 is a schematic logic block diagram of another embodiment of the present invention.

FIG. 6 is a schematic logic block diagram of another embodiment. The Cambridge Scanner single-click circuit is used as an example. A block 61 (G1 Rising Flag) and a block 62 (G2 Rising Flag) respectively represent that the upper bridge trigger signal (Gate signal 1) and the lower bridge trigger signal (Gate signal 2) are rising. A block 63 is a NOR gate, and a block 64 is a first single-click trigger. A block 65 (G1 Dropping Flag) and a block 66 (G2 Dropping Flag) respectively represent that the upper bridge trigger signal (Gate signal 1) and the lower bridge trigger signal (Gate signal 2) are decreasing. A block 67 is an OR gate, and a block 68 is a second single-click trigger. The first single-click trigger of block 64 includes a NAND gate 641, a capacitor 642, a resistor 643, and a NOT gate 644. The second click trigger of block 68 includes an OR gate 681, a capacitor 682, a resistor 683 and a NOT gate 684.

Figure 7:
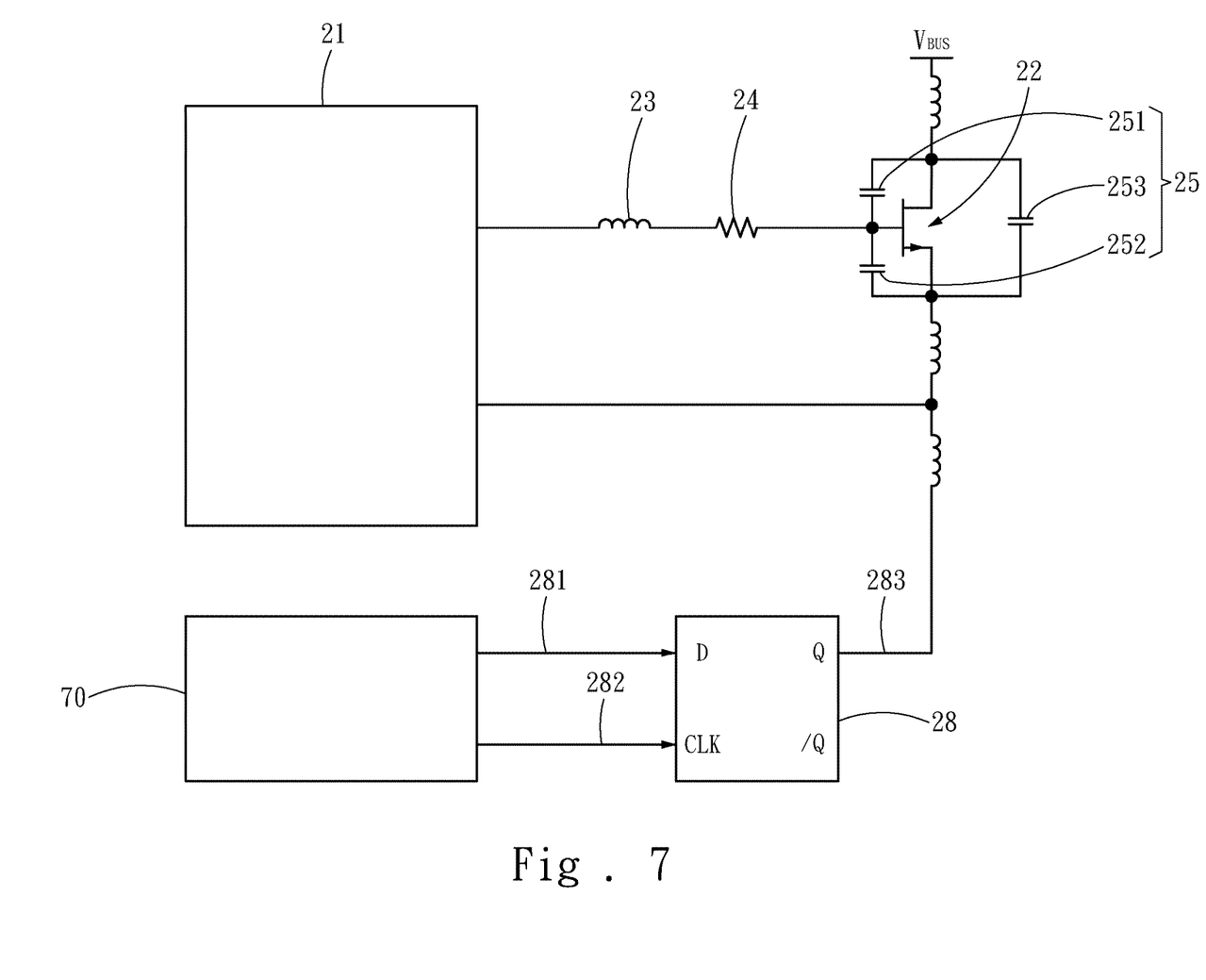
FIG. 7 is a schematic diagram of circuit structure of another embodiment of the present invention.
Figure 8:
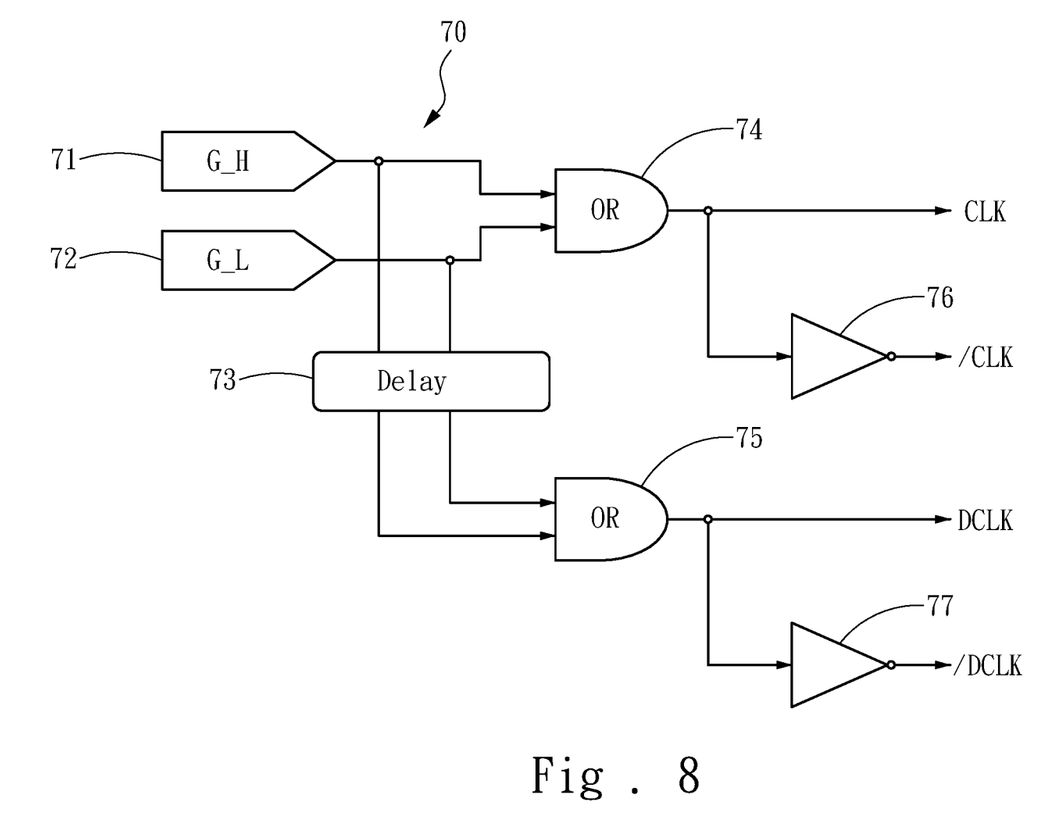
FIG. 8 is a schematic logic block diagram of FIG. 7.
Figure 9:
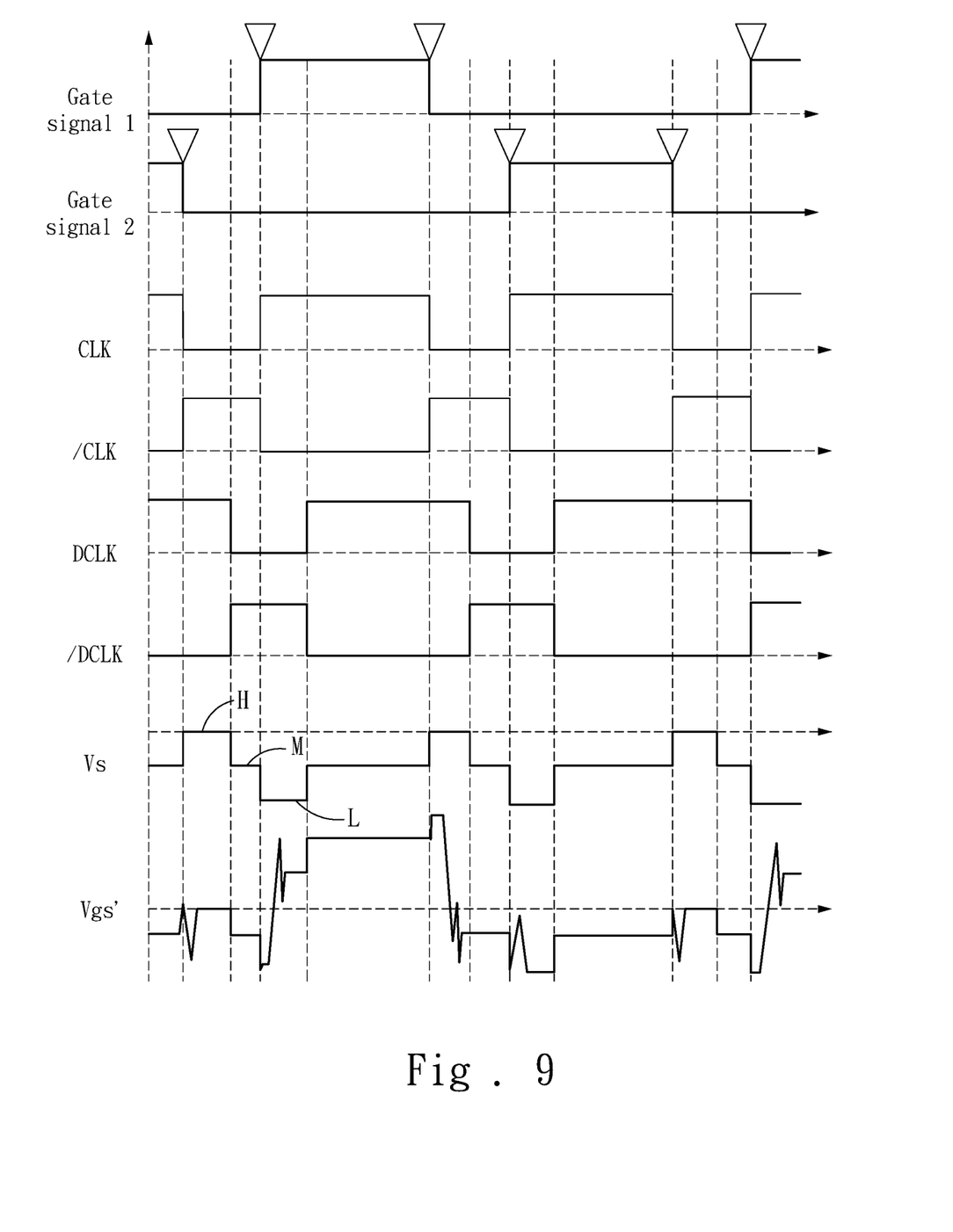
FIG. 9 is a schematic diagram of voltage output of the embodiment of FIG. 7.

FIG. 7 is a schematic diagram of a circuit structure of another embodiment. Compared with FIG. 5, a D-latch flip-flop 28 is used in this embodiment. The D-latch flip-flop 28 is coupled to a logic unit 70. The D-latch flip-flop 28 determines an output 283 according to a first input signal 281 and a second input signal 282 generated by the logic unit 70. For a schematic logic block diagram of the logic unit 70, please refer to FIG. 8. Blocks 71 and 72 respectively represent the upper bridge trigger signal (Gate signal 1) and the lower bridge trigger signal (Gate signal 2). A block 73 is a delayer, blocks 74 and 75 are OR gates, and blocks 76 and 77 are inverters. The upper bridge trigger signal (Gate signal 1) and the lower bridge trigger signal (Gate signal 2) are input to the logic unit 70 to generate CLK signals, /CLK signals, DCLK signals, and /DCLK signals. In detail, the CLK signals and DCLK signals are the first input signal 281 which are input to and the D terminal of the D-latch flip-flop 28, and the /CLK signals and the /DCLK signals are the second input signals 282 which are input to the CLK terminal of the D-latch flip-flop 28. FIG. 9 is a schematic diagram of a voltage output according to the embodiment of FIG. 7.

Figure 10:
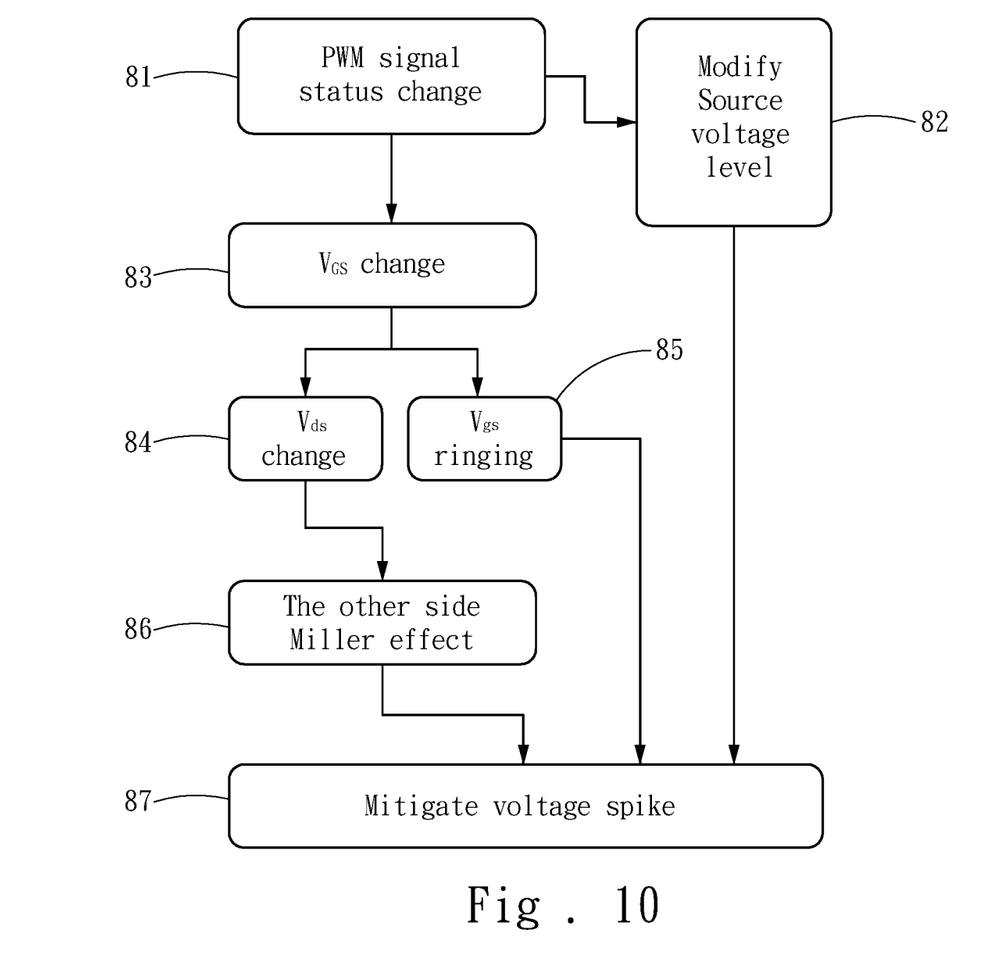
FIG. 10 is a schematic diagram of an operation flow of an embodiment of the present invention.

FIG. 10 is a schematic flowchart of an embodiment of the present invention. The upper bridge trigger signal (Gate signal 1) and the lower bridge trigger signal are regarded as a pulse width modulation signal (PWM signal). First, if the state of the pulse width modulation signal is detected to change (81), the source voltage (Vs) is adjusted to rise or fall (82). Then, the rise or fall of the source voltage (Vs) induces the gate-to-source voltage (Vgs) to change (83), and the drain-to-source voltage (Vds) also changes according to change of the gate-to-source voltage (Vgs) (84). Accordingly, a ringing phenomenon of the gate-to-source voltage (Vgs) is observed, and a Miller effect occurs by change of the drain-to-source voltage (Vds) (86). Finally, the source voltage (Vs) is adjusted according to changes of the pulse width modulation signal, thereby suppressing or reducing the spike of the gate-to-source voltage (Vgs) (87).

In summary, the present invention controls the source voltage to suppress the spike caused by the change of the gate-to-source voltage (Vgs), thereby solving the problem of crosstalk occurring in a silicon carbide semiconductor power element.

What is claimed is:

1. A method for controlling a silicon carbide power device, the method comprising the following steps:
   providing a silicon carbide power device which is controlled by a driver, wherein the silicon carbide power device has a gate-to-source voltage and a source voltage, and the source voltage has at least a high level, a low level, and an intermediate level between the high level and the low level; and
   alternately outputting an upper bridge trigger signal and a lower bridge trigger signal by the driver to a gate of the silicon carbide power device, wherein when the gate-to-source voltage increases according to the upper bridge trigger signal or the lower bridge trigger signal, the source voltage decreases temporarily for a duration from the intermediate level to the low level or from the high level to the intermediate level, and when the gate-to-source voltage decreases according to the upper bridge trigger signal or the lower bridge trigger signal, the source voltage increases temporarily for a duration from the low level to the intermediate level or from the intermediate level to the high level, wherein a delay through a delay circuit of the driver occurs and the delay is the temporary duration of the decreasing of the source voltage or the temporary duration of the increasing of the source voltage.

* * * * *